March 12, 1968 T. D. FUJINAMI 3,373,294

LINEAR LOGARITHMIC AMPLIFYING DETECTOR

Filed Nov. 4, 1964

INVENTOR.
TAKESHI D. FUJINAMI
BY
Floyd M. Harris
Attorney 3,373,294

LINEAR LOGARITHMIC AMPLIFYING DETECTOR

Takeshi Don Fujinami, Los Angeles, Calif., assignor to Radio Corporation of America, a corporation of Delaware Filed Nov. 4, 1964, Ser. No. 408,915
5 Claims. (Cl. 307—230)

ABSTRACT OF THE DISCLOSURE

There is disclosed a plural stage cascade linear logarithmic amplitude modulated-carrier frequency amplifier which does not require any external detector for demodulating the amplitude modulated carrier frequency input signal applied thereto. This is accomplished by producing an output signal from each stage which is characterized by having both a carrier frequency component and a direct current component, the respective value of each of which is an approximately linear gain function of the amplitude of the signal at the input of that stage when the amplitude of the input signal is below a given value and each of which has a respective fixed value which is independent of the amplitude of that input signal when the amplitude of that input signal is at least this given value. The carrier frequency component of each stage is applied as an input to the next succeeding stage, while the direct current components of all of the stages are combined to produce the demodulated output of the circuit.

My invention relates to logarithmic amplifiers, and particularly to logarithmic amplifiers employing transistors.

The present invention utilizes transistor amplifier stages each having a relatively low collector load impedance so that emitter detection takes place when the amplifier stage is driven into a non-linear region, and takes advantage of the fact that the output impedance of the emitter detector is low and, therefore, primarily a current supplying device. The logarithmic characteristic is obtained by a voltage divider action as will be explained hereinafter, rather than by the conventional voltage summing of the detector outputs. In this way an improved and simplified transistorized logarithmic amplifier is obtained.

The invention will be described in detail with reference to the accompanying drawings in which.

In the several figures like parts are indicated by similar reference characters.

Figure 1:
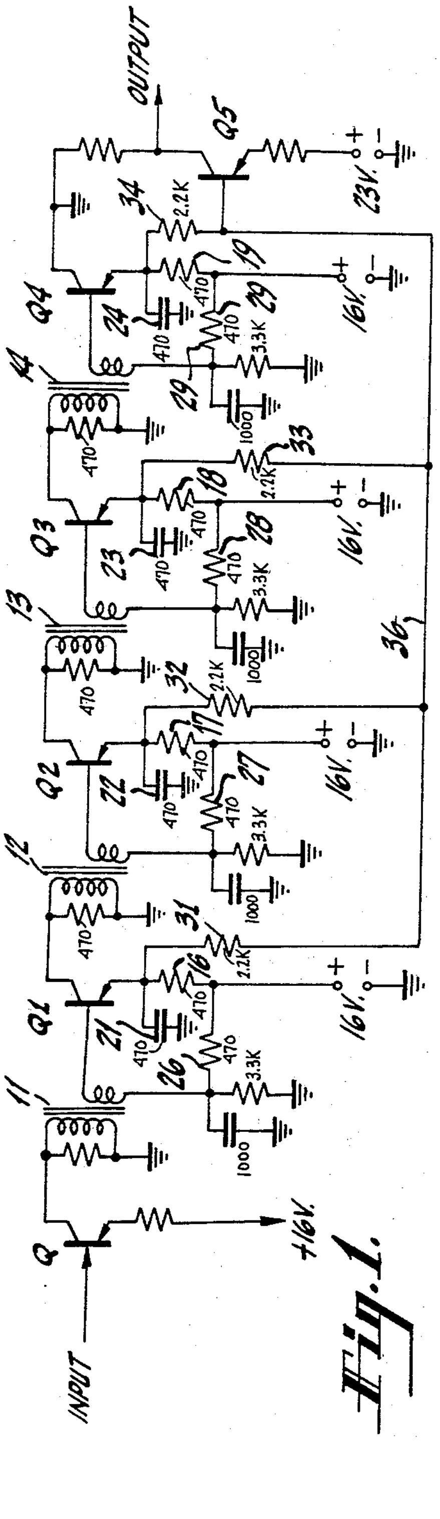
FIG. 1 is a circuit diagram of an embodiment of the invention.

FIG. 1 illustrates an intermediate frequency amplifier designed for a carrier frequency of 60 megacycles. This particular logarithmic amplifier is designed for use in transponders. The invention, however, applies generally to logarithmic amplifiers.

In the example shown in FIG. 1, the logarithmic amplifier comprises cascaded transistor amplifier stages including PNP type transistors Q1, Q2, Q3 and Q4. Input signal is applied to transistor Q1 by way of an amplifier comprising a transistor Q which has its output circuit coupled to the input circuit of Q1 through an I-F transformer 11. The logarithmic amplifier stages are coupled by I-F transformers 12, 13 and 14, the primary of each having a 470 ohm resistor connected across it. Each I-F transformer couples the collector output circuit of a transistor to the base-emitter input circuit of the following transistor. The collector load impedance of transistors Q1, Q2, Q3 and Q4 is relatively low. Suitable operating voltages are applied to the emitters of these transistors and to the emitter of transistor Q, the operating voltage being, for example, plus 16 volts. The operating voltage for each transistor may be supplied from separate batteries as indicated in the drawing, or it may be supplied from a single battery by way of a conductor provided with suitable filtering to prevent I-F feedback between amplifier stages.

The operating voltage is applied to the emitters of each of transistors Q1, Q2, Q3 and Q4 through 470 ohm resistors 16, 17, 18 and 19, respectively, which function as output resistors for the detected video signal. The value of 470 ohms, like other circuit values indicated, is given merely by way of example. The resistors 16, 17, 18 and 19 are bypassed to ground by capacitors 21, 22, 23 and 24, respectively, which have a proper capacity value to bypass the I-F signal while preventing high impedance to the detected video signal. In the case of a transponder the "video" signal is the code signal such as the interrogation pulses. In the present example these bypass capacitors have a value of 470 micro-microfarads.

The input circuit of each of the transistors Q1, Q2, Q3 and Q4 comprises the secondary of the I-F transformer which has one terminal connected to the transistor base, and which has the other terminal connected to the emitter through a 470 ohm biasing resistor and the 470 ohm output resistor. The output resistors are the resistors 16, 17, 18 and 19 previously indicated. The biasing resistors are the resistors 26, 27, 28 and 29. Each biasing resistor is connected in series with a 3.3K (K represents 1000 ohms) resistor, the two resistors in series being connected across the 16 volt supply. It is apparent that the voltage drop across the biasing resistor, resistor 26 for example, results in a negative bias voltage being applied to the base of the transistor. This bias voltage is adjusted with respect to the negative voltage on the emitter due to voltage drop in the output resistor, resistor 16 for example, so that the transistor is properly biased to function for amplification. The 3.3K resistors are each bypassed by a 1000 micro-microfarad capacitor for bypassing the I-F signal.

The detected signal (video signal) is supplied to the amplifier output circuit through a 2.2K resistor when a transistor is driven hard enough to detect. Specifically, resistors 31, 32, 33 and 34, each of which has the same resistance of 2.2K, are connected from the emitter end of output resistors 16, 17, 18 and 19, respectively, to a common output lead 36 and to the base of an output transistor Q5. The resistance of the 2.2K resistors 31, 32, 33 and 34 is much larger than the emitter detector output impedance which, in the present example, is approximately 11 ohms. The specific resistance value of 2.2K is given merely by way of example. It will be understood that the emitter detector output impedance is the impedance when viewed back into the detector as, for example, from the junction of resistor 16 and the emitter of Q1.

It may be noted that by making the resistors 31, 32, 33 and 34 of a high impedance compared with the detector output impedance, any substantial feedback between detectors is avoided. For example, when Q3 and Q4 only are detecting, there will be very little voltage fed from their emitters to the emitters of Q1 and Q2. Since the detector output impedance is very low, the resistors 31, 32, 33 and 34 need not have an extremely large impedance value in order that it be much larger than the detector output impedance. Thus, there is good pulse response at the amplifier output even though there is some unavoidable stray capacitance such as capacitance from the lead 36 to ground.

It should be noted that in each amplifier stage, if the stage is not detecting, the end of the 2.2K resistor connected to the emitter is held at a reference potential for detected signals by way of the 470 ohm output resistor and the battery connection. This reference potential is ground in the example shown, the 16 volt battery being of low impedance or bypassed, if desired, for detected signals. Thus, with respect to detected signals, the 2.2K resistors are connected by way of the 470 ohm output resistors to a common point if the stage in which the 2.2K resistor is located is not detecting. Thus, for example, if only the stage Q4 is detecting, it supplies detected signal current through the 2.2K resistor 34 and through the remaining 2.2K resistors 31, 32 and 33 in parallel, these remaining resistors being in parallel since they connect to a common reference potential point as above explained. It is apparent that in this case the output signal applied to Q5 is the voltage drop across the three 2.2K resistors in parallel, ignoring the drop across the 470 ohm output resistors which is small by comparison.

It may be noted that an I-F stage begins to limit when it begins to detect. Detection at an I-F stage begins when the I-F signal at that stage reaches a certain amplitude. At that time a positive half cycle of the I-F signal drives the transistor (Q3 for example) to collector current cut-off, resulting in detection (by Q3 in this case) because the collector current is now greater on a negative cycle swing than on a positive cycle swing.

Figure 2A:
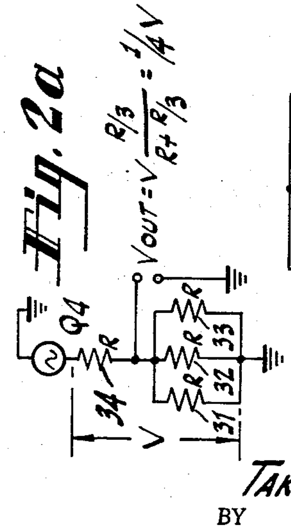
FIGS. 2A, 2B, 2C and 2D are diagrams which are referred to in explaining the operation of the circuit of FIG. 1.

Reference to FIGS. 2A, 2B, 2C and 2D will aid in understanding the operation of the amplifier shown in FIG. 1. When the strength of the input signal is sufficient to cause the last stage Q4 to detect while Q3 just barely begins to detect, the contribution to the output signal will be only from Q4. This condition is illustrated in FIG. 2A. Note that the resistor 34 in series with the parallel connected resistors 31, 32 and 33 forms a voltage divider so that the output voltage is ¼V where V is the maximum detected output voltage of the video signal from Q4. In FIG. 2A the resistors are shown as having the same resistance of a value R. The diagram is simplified by showing resistors 31, 32 and 33 connected directly to ground, rather than being connected to ground through the comparatively low impedance output resistors 16, 17 and 18.

Assume that the gain of each amplifying stage is 20 db, for example, and assume that the input signal to the first stage is increased by 20 db. Now detected (video) signal appears at the emitter of both Q3 and Q4, but not at Q1 and Q2. The output voltage is now contributed by Q3 and Q4. The maximum detected output voltage, however, is still of value V just as it was when only Q4 contributed output voltage. This is also true when Q1 and Q2 contribute output voltage since all the amplifier stages are made identical, or substantially so, whereby the limiting points will be equal. Therefore, the maximum detected output voltage at each emitter will be very nearly equal. Also, since the base-emitter detectors have low output impedance, the maximum detected output voltage appearing across the voltage divider combination of resistors will remain at the value V whether the combination is as shown in FIG. 2A, FIG. 2B, FIG. 2C, or FIG. 2D.

Figure 2B:
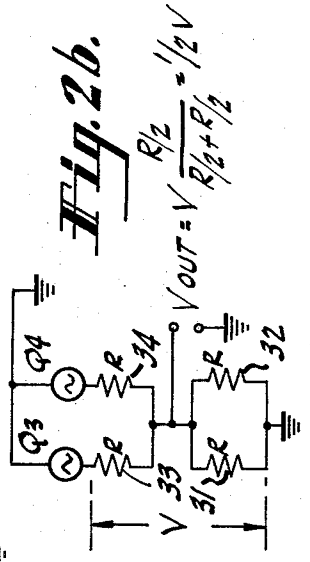

The condition where Q3 and Q4 contribute output voltage is illustrated in FIG. 2B. Now resistors 33 and 34, in effect, are in parallel and connected in series with resistors 31 and 32 which are also in parallel. The resulting output voltage appearing across resistors 31 and 32 is ½V.

That resistors 33 and 34 are effectively in parallel can be seen from the fact that a connection can be made between the upper ends of these resistors and no current will flow through the connection because Q3 and Q4 each provide the same signal, i.e., the maximum detected voltage. Actually, the explanation of circuit operation here given is a simplified explanation, but a correct one. A complete analysis of circuit operation requires the use of mesh equations and the inclusion of such analysis would unnecessarily lengthen the patent application.

Figure 2C:
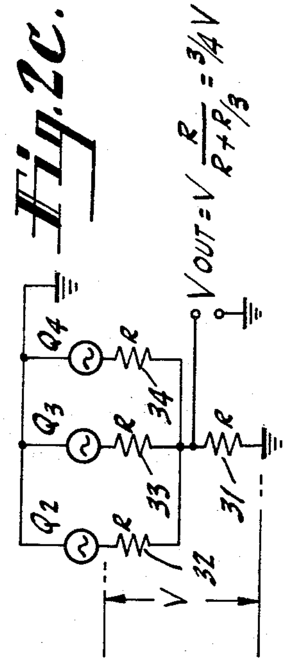

When the input signal increases another 20 db, the detected signal will appear at the emitters of Q2, Q3 and Q4. This is illustrated in FIG. 2C. The output voltage is now ¾V.

Figure 2D:
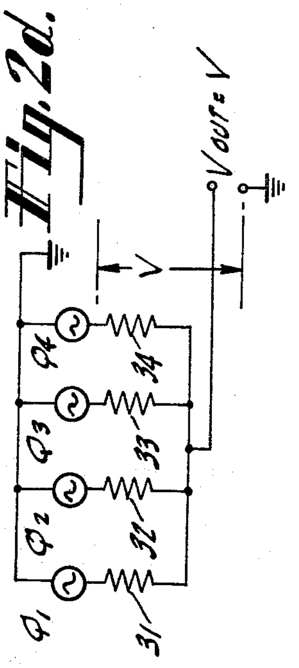

When the input signal increases still another 20 db, the detected signal will appear at the emitters of Q1, Q2, Q3 and Q4. This is illustrated in FIG. 2D. The output voltage now is the full voltage V. As in the other conditions assumed, the value V is the maximum detected output voltage of each base-emitter detector of the transistors.

The foregoing example shows that the output voltage increases ¼V for each 20 db increase in the input signal. Thus, the output voltage is a logarithmic function of the input signal.

What is claimed is:

1. In signal translating apparatus comprising a plurality of amplifier stages connected in cascade which are responsive to a given carrier frequency signal amplitude modulated in accordance with an information signal applied as an input to the first of said stages; the improvement wherein each of said stages includes an input circuit and an output circuit, said output circuit of each stage except the last of said stages comprising a first frequency sensitive portion which exhibits a significant impedance at said carrier frequency and a negligible impedance for said information signal, said output circuit of each stage further comprising a second frequency sensitive portion which exhibits a significant impedance for said information signal and a negligible impedance for said carrier frequency, the input circuit of each stage other than said first being coupled to said first frequency sensitive portion of the output circuit of the preceding stage, each of said stages further including a control device responsive to an input signal at the input circuit of that stage for applying an output signal to the output circuit of that stage, said output signal being characterized by having a carrier frequency component at said given carrier frequency and a direct current component, the respective value of each of said components being an approximately linear gain function of the amplitude of the signal at the input circuit of that stage when the amplitude of that input signal is below a given value and each of said components having a respective fixed value which is independent of the amplitude of that input signal when the amplitude of that input signal is at least said given value, whereby said second frequency sensitive portion of the output circuit of each stage is effective in detecting said information signal, and signal combining means coupled to said respective second frequency sensitive portions for deriving as a final output signal said information signal with a magnitude which is substantially proportional to a linear logarithmic function of the amplitude of said input to said first of said stages.

2. The signal translating apparatus defined in claim 1, wherein said signal combining means includes a separate impedance coupling the respective second frequency sensitive portion of each stage to a common point, the value of said separate impedance for said information signal being high relative to the value of said significant impedance of said second frequency portion.

3. The signal translating means defined in claim 1, wherein said control device for each stage comprises a transistor having a base electrode, an emitter electrode and a collector electrode, wherein said first frequency sensitive portion comprises a carrier-frequency transformer having its primary winding coupled between said collector electrode and a point of reference potential and its secondary winding coupled to the input circuit of the next succeeding stage, wherein said second frequency sensitive portion comprises means including a resistance connecting said emitter electrode to said point of reference potential and a by-pass capacitance shunting said means including said resistance, and wherein said input circuit is coupled between said base electrode and said point of reference potential.

4. The signal translating apparatus defined in claim 3, wherein said transistor of each stage is properly biased to produce an output signal having said characteristics.

5. The signal translating device defined in claim 3, wherein said signal combining means includes a separate second resistance connecting the emitter electrode of each respective stage to a common point, the value of said second resistance being high with respect to the value of said first-named resistance of said second frequency sensitive portion, and an information signal amplifier having an input coupled between said common point and said point of reference potential.

References Cited

UNITED STATES PATENTS

| | | | |
|---|---|---|---|
| 2,774,825 | 12/1956 | Sherr | 328—145 |
| 2,933,695 | 4/1960 | Ruvin | 328—145 X |
| 3,032,716 | 5/1962 | Harris | 328—145 |
| 3,061,789 | 10/1962 | Mace | 328—145 X |

JOHN S. HEYMAN, *Primary Examiner.*

J. JORDAN, *Assistant Examiner.*